US006778483B2

United States Patent
Mouri et al.

(10) Patent No.: US 6,778,483 B2
(45) Date of Patent: Aug. 17, 2004

(54) MULTILEVEL RECORD MODULATOR AND DEMODULATOR

(75) Inventors: Hiroki Mouri, Osaka (JP); Takashi Yamamoto, Fukuoka (JP); Hiroyuki Nakahira, Kyoto (JP); Akira Yamamoto, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 512 days.

(21) Appl. No.: 09/984,768

(22) Filed: Oct. 31, 2001

(65) Prior Publication Data

US 2002/0054557 A1 May 9, 2002

(30) Foreign Application Priority Data

Nov. 8, 2000 (JP) ........................................ 2000-340006

(51) Int. Cl.[7] ................................................. G11B 5/76
(52) U.S. Cl. .............................. 369/59.23; 369/124.04; 341/106
(58) Field of Search ............................. 369/47.19, 59.1, 369/59.23, 59.24, 59.26, 124.04, 124.08; 360/40; 341/56, 57, 59, 106

(56) References Cited

U.S. PATENT DOCUMENTS 6,002,718 A * 12/1999 Roth .......................... 375/240

FOREIGN PATENT DOCUMENTS

JP 9-198737 7/1997

* cited by examiner

*Primary Examiner*—Paul W. Huber
(74) *Attorney, Agent, or Firm*—McDermott Will & Emery LLP

(57) ABSTRACT

An encoding efficiency higher than 1 is achieved by accomplishing ternary recording on a recording medium. For this purpose, an 8-bit binary data word is converted to a 5-symbol ternary code word. A look-up table stores a modulation/demodulation table defining the correspondence between the binary data word (8B) and the ternary code word (5T). A table generating circuit generates the modulation/demodulation table to be stored in the look-up table such that each of constraints specified by a plurality of parameters is satisfied. If a PRML (Partial Response Maximum Likelihood) scheme is combined with an 8B5T code thus obtained, a signal-to-noise ratio is improved.

11 Claims, 4 Drawing Sheets

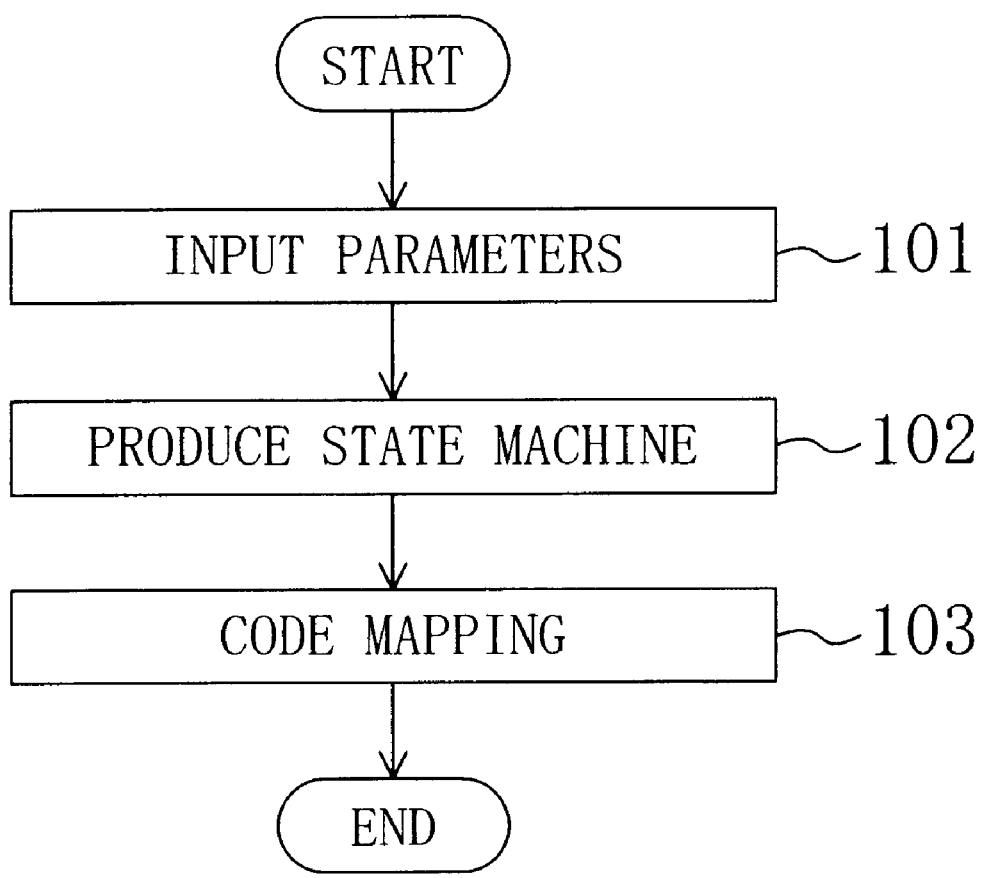

$$D = \begin{bmatrix} 1 & 1 & 0 & 0 & 0 \\ 1 & 1 & 1 & 0 & 0 \\ 0 & 1 & 1 & 1 & 0 \\ 0 & 0 & 1 & 1 & 1 \\ 0 & 0 & 0 & 1 & 1 \end{bmatrix}$$

$$A = \begin{bmatrix} 0 & 1 & \phi & \phi & \phi \\ 2 & 0 & 1 & \phi & \phi \\ \phi & 2 & 0 & 1 & \phi \\ \phi & \phi & 2 & 0 & 1 \\ \phi & \phi & \phi & 2 & 0 \end{bmatrix}$$

MULTILEVEL RECORD MODULATOR AND DEMODULATOR

BACKGROUND OF THE INVENTION

The present invention relates to a record encoding system associated with recording media such as an optical disk and a magnetic disk and, more particularly, to a modulator and demodulator using a multilevel recording system.

For error-free reproduction of information recorded at a high density on a recording medium, various techniques have been studied thus far. Specific examples thereof include PRML (Partial Response Maximum Likelihood), DFE (Decision Feedback Equalizer), TCPR (Trellis Coding Partial Response), and the like. These techniques have been used for, e.g., signal processing LSIs for a hard disk apparatus.

Of the foregoing techniques, PRML uses a partial response (PR) scheme and a Viterbi decoding scheme which is one of maximum likelihood (ML) decoding schemes. The partial response scheme is a signal processing scheme which performs data reproduction by positively utilizing an inter-code interference (interference between adjacent sets of data or between adjacent reproduced signals). The Viterbi decoding scheme is also termed a maximum likelihood data-sequence estimation scheme, which reproduces a most likely data sequence by using data of the past in a time sequence.

On the other hand, the introduction of new modulation codes is also observed. As representatives of the new modulation codes, there can be mentioned a rate 8/9 modulation code, a rate 16/17 modulation code, a (1, 7) RLL code, and the like. In the foregoing, RLL stands for Run Length Limited. In conventional systems, however, binary recording has been the main stream.

In recent years, optical disks such as a CD-R/W (Compact Disk Re-writable), a DVD (Digital Versatile Disk), and the like have been used widely and the recording densities thereof have been increased on a year-by-year basis. However, a conventional encoding efficiency has been 1 or less due to binary recording and a further increase in recording density cannot be expected under present circumstances.

SUMMARY OF THE INVENTION

It is therefore an object of the present invention to accomplish higher-density recording particularly on an optical disk.

To attain the object, the present invention provides a multilevel record modulator and demodulator having a function of converting a p-bit (p is an integer) binary data word to a q-symbol (q is an integer) multilevel code word such that multilevel recording on a recording medium is accomplished, the modulator and demodulator having: a look-up table for storing a modulation/demodulation table defining a correspondence between the binary data word and the multilevel code word; and a table generating circuit for receiving a plurality of parameters and generating the modulation/demodulation table to be stored in the look-up table such that each of constraints specified by the plurality of parameters is satisfied.

BRIEF DESCRIPTION OF THE DRAWINGS

FIG. 3 is a flow chart showing the procedure of processing in the table generating circuit of FIG. 2.

FIGS. 4A, 4B, and 4C show examples of the intermediate result of processing in the table generating circuit of FIG. 2, of which FIG. 4A shows the concept of a state transition, FIG. 4B shows a state transition matrix, and FIG. 4C shows an output-symbol transition matrix.

DETAILED DESCRIPTION OF THE INVENTION

Figure 1:
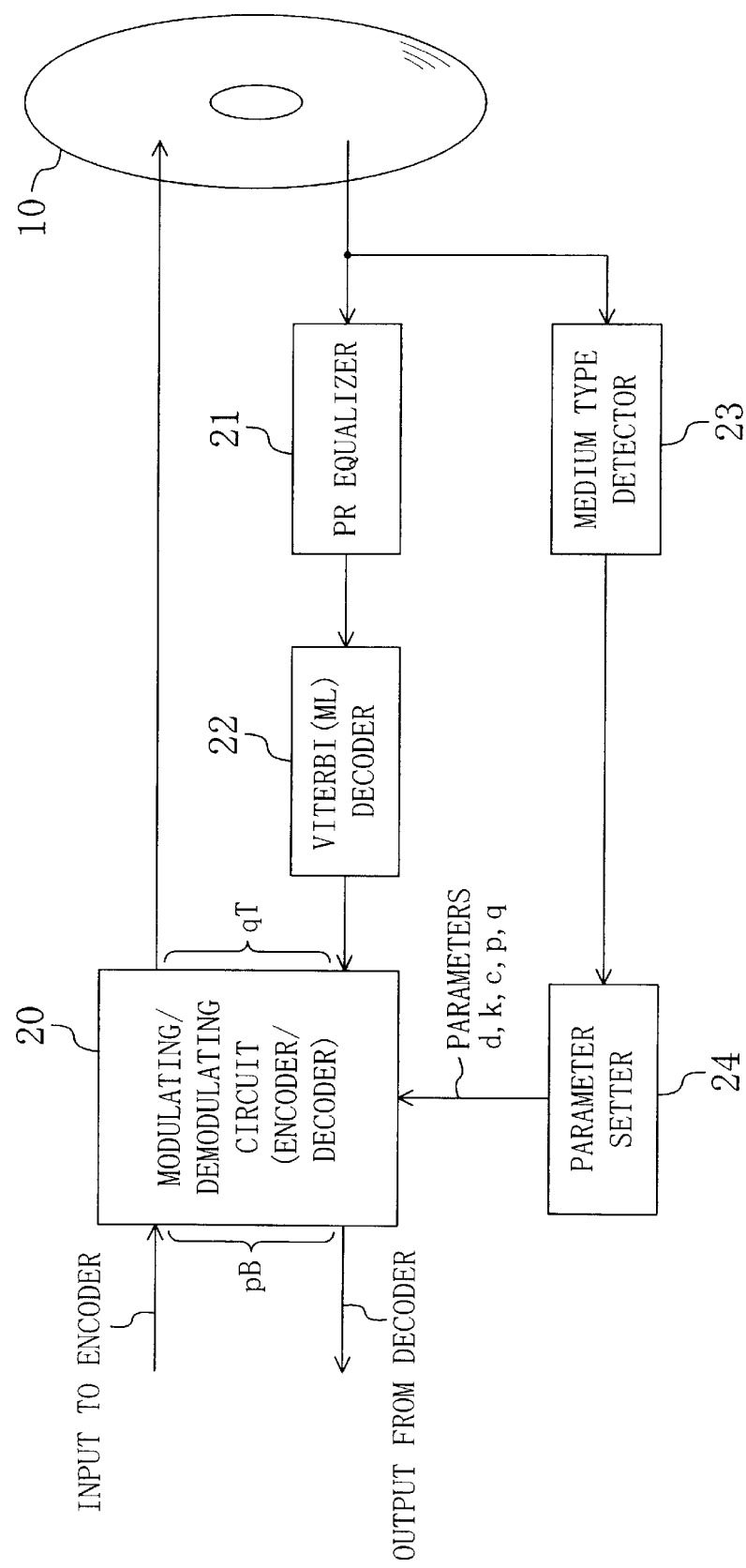
FIG. 1 is a block diagram showing a structure of an optical-disk recording/reproducing apparatus using a multilevel record modulator and demodulator according to an embodiment of the present invention.

FIG. 1 shows a structure of an optical-disk recording/reproducing apparatus using a multilevel record modulator and demodulator according to an embodiment of the present invention. In FIG. 1, reference numeral 10 denotes a recording medium (optical disk), 20 denotes a modulating/demodulating circuit (encoder/decoder), 21 denotes a PR equalizer, 22 denotes a Viterbi (ML) decoder, 23 denotes a medium type detector, and 24 denotes a parameter setter. The PR equalizer 21 is composed of an analog filter, an A/D converter, and the like.

The modulating/demodulating circuit 20 has the function of converting, if each of p and q is an integer, a p-bit binary data word to a q-symbol ternary code word and the function of the reverse conversion thereof to achieve the ternary recording on the recording medium 10. It is assumed here that the p-bit binary data word is "pB" and the q-symbol ternary code word is "qT". Each of the bits in the binary data word can have a value of 0 or 1 and each of the symbols in the ternary code word can have a value of 0, 1, or 2.

Figure 2:
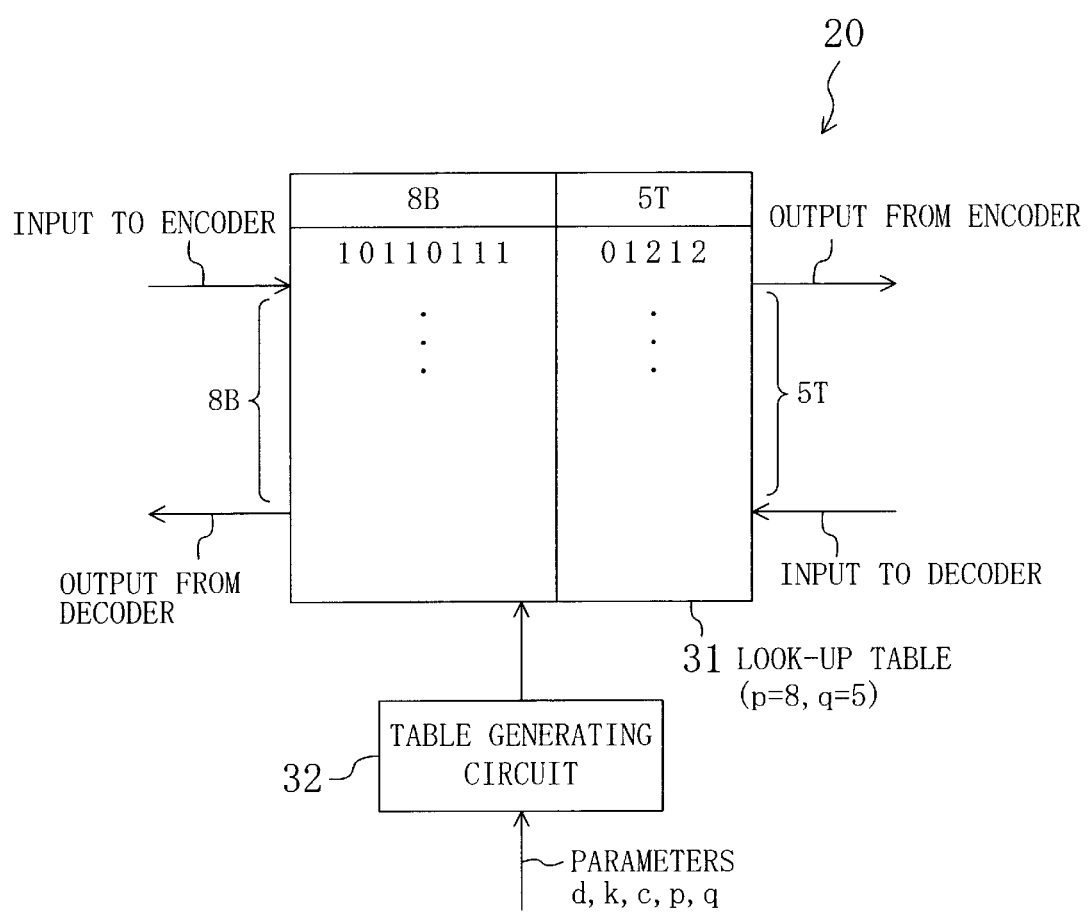
FIG. 2 is a block diagram showing an example of a structure of the modulating/demodulating circuit of FIG. 1.

FIG. 2 shows an example of a structure of the modulating/demodulating circuit 20 of FIG. 1, i.e., an 8B5T modulating/demodulating circuit having the function of converting the 8-bit binary data word to the 5-symbol ternary code word, where p=8 and q=5. The modulating/demodulating circuit 20 of FIG. 2 has a look-up table 31 and a table generating circuit 32. The look-up table 31 is for storing a modulation/demodulation table which defines the correspondence between the 8-bit binary data word (8B) and the 5-symbol ternary code word (5T). The table generating circuit 32 is a circuit for receiving a plurality of parameters d, k, c, p, and q and generating a modulation/demodulation table to be stored in the look-up table 31 such that each of constraints specified by the plurality of parameters is satisfied. The parameters d, k, and c represent a minimum run length, a maximum run length, and an accumulated charge constraint, respectively. As stated previously, p is the number of bits in the binary data word and q is the number of symbols in the ternary code word. The look-up table 31 is composed of a memory which is re-writable as required, such as a RAM (Random Access Memory), such that a modulation/demodulation table constituted in accordance with the parameters d, k, c, p, and q are written therein as required.

FIG. 3 shows the procedure of processing in the table generating circuit 32 of FIG. 2. In Step 101, various parameters are inputted. In Step 102, a state machine (state transition diagram) is produced. In Step 103, code mapping is performed.

Figures 4A, 4B, 4C:
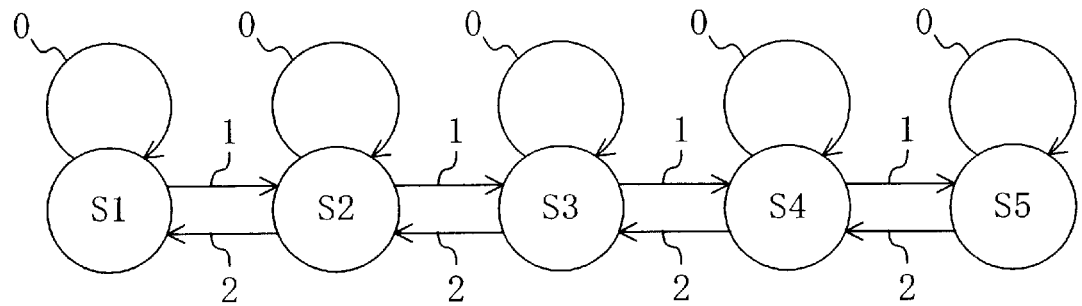

FIGS. 4A, 4B, and 4C show examples of the intermediate result of processing in the table generating circuit 32, of which FIG. 4A shows the concept of a state transition, FIG. 4B shows a state transition matrix D, and FIG. 4C shows an output-symbol transition matrix A.

In the state-transition diagram of FIG. 4A, five states S1 to S5 are defined. Here, the accumulated charge constraint (c) is assumed to be 2 and the five states corresponding to the respective cases where the amounts of charge are −2, −1, 0, +1, and +2 are assumed. As can be seen from FIG. 4A, an output-symbol value 0 is assigned to the transition from the state S1 to the state S1, an output symbol value 1 is assigned to the transition from the state S1 to the state S2 and an output-symbol value 2 is assigned to the transition from the state S2 to the state S1. The state transition diagram allows the state transition matrix D of FIG. 4B and the output-symbol transition matrix A of FIG. 4C to be determined.

In the state transition matrix D of FIG. 4B, "1" is observed when there is a transition from any of the states and "0" is observed when there is no transition. In the first row of the state transition matrix D, e.g., the first "1" indicates that there is a transition from the state S1 to the state S1, the second "1" indicates that there is a transition from the state S1 to the state S2, and the three "0"s indicate that there is no direct transition from the state S1 to the state S3, S4, or S5.

In the output-symbol transition matrix A of FIG. 4C, each of the matrix elements (0, 1, and 2) indicates the corresponding one of the output-symbol values in the state transition diagram of FIG. 4A and "Φ" indicates that there is no symbol outputted from the states.

If n is assumed to be an integer, the number of code words in each of the states is obtainable by raising the state transition matrix D to the power of n and a specific code word is constituted by raising the output-symbol transition matrix A to the power of n. Further, a desired modulation/demodulation table is obtainable by adding the constraints of d and k to the code word constituted (code mapping).

By using the modulation/demodulation table in the 8B5T code thus obtained, an encoding efficiency of 1.600 (>1) is achieved. If consideration is given to a conventional encoding efficiency which is 0.888 in the rate 8/9 code and 0.941 in the rate 16/17 code, it will be appreciated that the present embodiment has significantly increased the encoding efficiency.

As can be seen from FIG. 1, in demodulating a ternary record obtained from the recording medium 10, the ternary record is given to the modulating/demodulating circuit 20 through the PR equalizer 21 and the Viterbi decoder 22.

As can also be seen from FIG. 1, the type of the recording medium 10 can be detected by the medium type detector 23. The type of the recording medium 10 is detected by, e.g., irradiating the recording medium 10 with a semiconductor laser and detecting the reflectivity thereof. The parameter setter 24 supplies an optimum combination of parameters in accordance with the detected medium type to the table generating circuit 32. For example, q=5 is set when the recording medium 10 is a DVD and q=6 is set when the recording medium 10 is a CD. If the value of q is thus determined, the operation of the table generating circuit 32 is determined based on the value of q and the modulation/demodulation table is updated.

Thus, according to the present embodiment, the encoding efficiency is increased drastically by adopting the 8B5T code and higher-density recording on, e.g., an optical disk is accomplished. Moreover, a low-pass component in a code configuration can be suppressed under the given conditions of the minimum run length (d), the maximum run length (k), and the accumulated charge constraint (c). Furthermore, the S/N (signal-to-noise) ratio can be improved by combining the 8B5T code with the PRML scheme.

A preferred combination of parameters is such that q=4 or 5 and (d, k, c)=(0, 3, 2), (0, 4, 2), (0, 5, 2), (1, 3, 2), (1, 4, 2), or (1, 5, 2). If d=1 is set, it is advantageous to the case where d=0 in terms of suppressing a dc component. In a DVD recording/reproducing apparatus, it is particularly preferred to constitute the 8B5T modulator and demodulator by setting (d, k, c)=(1, 4, 2). The value of p may be a power of 2 (including 8) or an integral multiple of a power of 2. It is also possible to fix at least one of the five parameters to a certain value depending on an application.

Ternary recording on an optical disk can be performed with a change in the state of pits corresponding to a symbol value (0, 1, or 2). Ternary recording on a magnetic disk may be performed appropriately with a record width corresponding to a symbol value. It is to be noted that the present invention does not prevent the use of multilevel recording involving the use of four or more values.

What is claimed is:

1. A multilevel record modulator and demodulator having a function of converting a p-bit (p is an integer) binary data word to a q-symbol (q is an integer) multilevel code word such that multilevel recording on a recording medium is accomplished, the modulator and demodulator comprising:
   a look-up table for storing a modulation/demodulation table defining a correspondence between the binary data word and the multilevel code word; and
   a table generating circuit for receiving a plurality of parameters and generating the modulation/demodulation table to be stored in the look-up table such that each of constraints specified by the plurality of parameters is satisfied.

2. The modulator and demodulator according to claim 1, wherein the table generating circuit receives the number p of bits in the binary data word as one of the plurality of parameters.

3. The modulator and demodulator according to claim 1, wherein the number p of bits in the binary data word is 8.

4. The modulator and demodulator according to claim 1, wherein the table generating circuit receives the number q of symbols in the multilevel code word as one of the plurality of parameters.

5. The modulator and demodulator according to claim 1, wherein the number q of symbols in the multilevel code word is 5.

6. The modulator and demodulator according to claim 1, wherein the table generating circuit receives respective parameters representing a minimum run length (d), a maximum run length (k), and an accumulated charge constraint (c) as some of the plurality of parameters.

7. The modulator and demodulator according to claim 6, which is an 8B5T modulator and demodulator having a function of converting an 8-bit binary data word to a 5-symbol ternary code word, wherein the modulation/demodulation table is generated under each of constraints of d=1, k=4, and c=2.

8. The modulator and demodulator according to claim 1, wherein the look-up table is composed of a memory which is re-writable as required.

9. The modulator and demodulator according to claim 1, further comprising:
   a maximum likelihood decoder connected to the look-up table for demodulation of a multilevel record.

10. The modulator and demodulator according to claim 9, further comprising:
    a partial response equalizer connected to the maximum likelihood decoder.

11. The modulator and demodulator according to claim 1, further comprising:
    a medium type detector for detecting a type of the recording medium; and
    a parameter setter for supplying, to the table generating circuit, an optimum combination of parameters in accordance with the detected medium type.

* * * * *